United States Patent
Kim

(10) Patent No.: US 11,600,714 B2
(45) Date of Patent: Mar. 7, 2023

(54) MANUFACTURING METHOD OF SEMICONDUCTOR DEVICE

(71) Applicant: SK hynix Inc., Icheon (KR)

(72) Inventor: Jin Ha Kim, Icheon (KR)

(73) Assignee: SK hynix Inc., Icheon (KR)

( * ) Notice: Subject to any disclaimer, the term of this patent is extended or adjusted under 35 U.S.C. 154(b) by 150 days.

(21) Appl. No.: 17/229,617

(22) Filed: Apr. 13, 2021

(65) Prior Publication Data

US 2021/0249525 A1 Aug. 12, 2021

Related U.S. Application Data

(63) Continuation of application No. 16/685,941, filed on Nov. 15, 2019, now Pat. No. 11,004,956.

(30) Foreign Application Priority Data

May 17, 2019 (KR) .................. 10-2019-0057766

(51) Int. Cl.
| | |
|---|---|
| *H01L 29/66* | (2006.01) |
| *H01L 21/02* | (2006.01) |
| *H01L 21/306* | (2006.01) |
| *H01L 27/11582* | (2017.01) |
| *H01L 27/11556* | (2017.01) |
| *H01L 27/112* | (2006.01) |
| *H01L 27/24* | (2006.01) |

(52) U.S. Cl.
CPC .. *H01L 29/66666* (2013.01); *H01L 21/02057* (2013.01); *H01L 21/02532* (2013.01); *H01L 21/02592* (2013.01); *H01L 21/02667* (2013.01); *H01L 21/30604* (2013.01); *H01L 27/11273* (2013.01); *H01L 27/11556* (2013.01); *H01L 27/11582* (2013.01); *H01L 27/2454* (2013.01)

(58) Field of Classification Search
CPC ......... H01L 27/11556; H01L 27/11273; H01L 27/11582; H01L 29/66666; H01L 27/2454; H01L 21/02057; H01L 21/02532; H01L 21/02592; H01L 21/02667; H01L 21/30604; H01L 21/321
See application file for complete search history.

(56) References Cited

U.S. PATENT DOCUMENTS

2016/0365353 A1 12/2016 Aoyama
2020/0035490 A1* 1/2020 He .................. H01L 21/02675

FOREIGN PATENT DOCUMENTS

KR 20170127785 A 11/2017

* cited by examiner

*Primary Examiner* — Thanhha S Pham

(57) ABSTRACT

A method of manufacturing a semiconductor device includes forming a stacked structure, forming an opening in the stacked structure, forming a preliminary channel layer in the opening, forming a channel layer by performing heat treatment on the preliminary channel layer, etching an inner surface of the channel layer, and performing ozone ($O_3$) treatment on an etched inner surface of the channel layer.

14 Claims, 8 Drawing Sheets

MANUFACTURING METHOD OF SEMICONDUCTOR DEVICE

CROSS-REFERENCE TO RELATED APPLICATION

The present application is a continuation of U.S. application Ser. No. 16/685,941 filed Nov. 15, 2019, which claims priority under 35 U.S.C. § 119(a) to Korean patent application number 10-2019-0057766, filed on May 17, 2019, which are incorporated herein by reference in their entirety.

BACKGROUND

Field of Invention

Various embodiments of the present disclosure generally relate to an electronic device, and more particularly, to a semiconductor device and a method of manufacturing the same.

Description of Related Art

Non-volatile memory devices retain stored data regardless of power on/off conditions. The increase in integration density of two-dimensional non-volatile memory devices in which memory cells are formed in a single layer over a substrate has recently been limited. Thus, three-dimensional non-volatile memory devices have been proposed in which memory cells are stacked in a vertical direction over a substrate.

A three-dimensional non-volatile memory device may include interlayer insulating layers and gate electrodes that are stacked alternately with each other, and channel layers passing therethrough, with memory cells stacked along the channel layers. Various structures and manufacturing methods have been developed to improve the operational reliability of three-dimensional non-volatile memory devices.

SUMMARY

Various embodiments are directed to a method of manufacturing a semiconductor device with easy manufacturing processes, a stabilized structure and improved characteristics.

According to an embodiment, a method of manufacturing a semiconductor device may include forming a stacked structure, forming an opening in the stacked structure, forming a preliminary channel layer in the opening, forming a channel layer by performing heat treatment on the preliminary channel layer, etching an inner surface of the channel layer, and performing ozone ($O_3$) treatment on an etched inner surface of the channel layer.

According to an embodiment, a method of manufacturing a semiconductor device may include depositing an amorphous silicon layer on a dielectric layer, forming a polysilicon layer by performing heat treatment on the amorphous silicon layer, etching the polysilicon layer to reduce a thickness of the polysilicon layer, and performing $O_3$ treatment on an etched surface of the polysilicon layer.

DETAILED DESCRIPTION

Figure 1A:
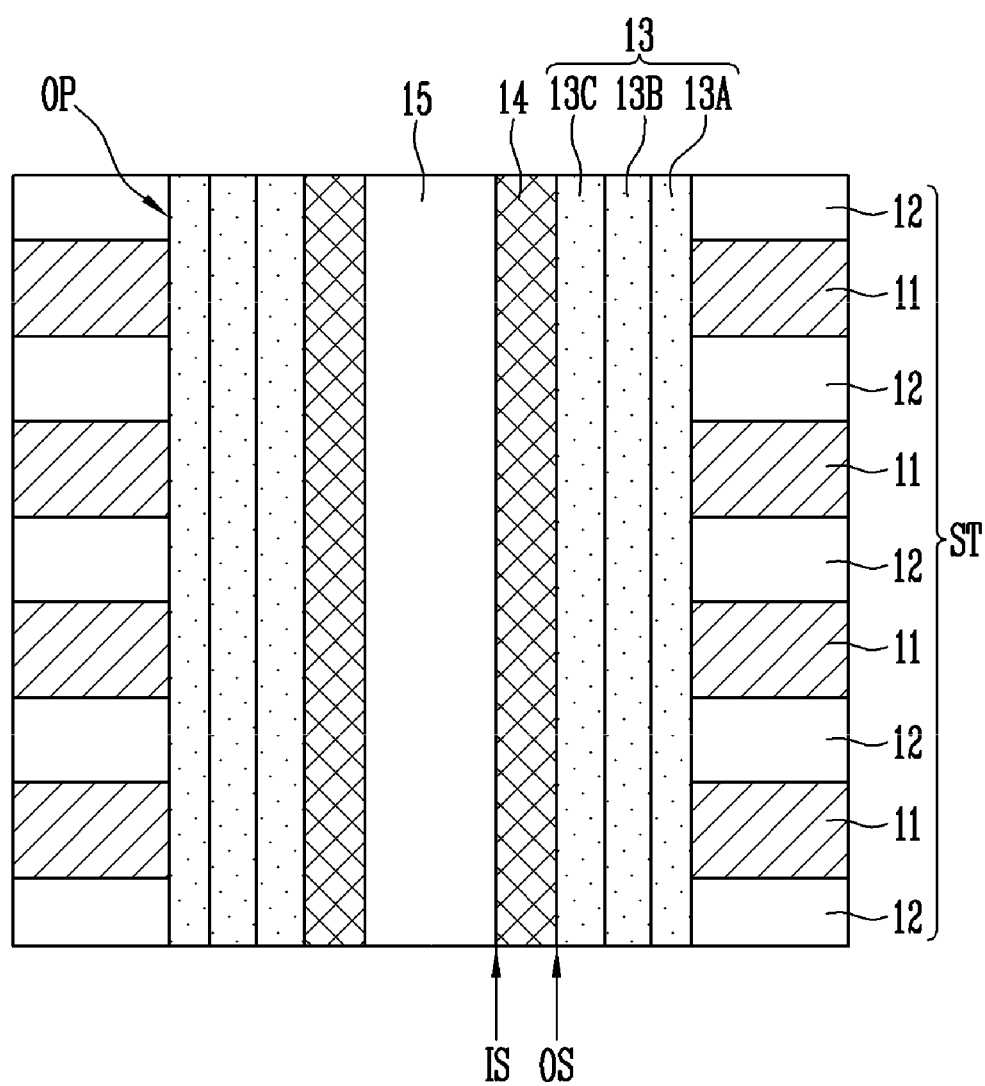
FIGS. 1A and 1B are views illustrating the structure of a semiconductor device according to an embodiment.

Hereinafter, various exemplary embodiments will be described in detail with reference to the accompanying drawings. In the drawings, thicknesses and lengths of components may be exaggerated for convenience of illustration. In the following description, detailed explanation of known related functions and constitutions may be omitted to avoid unnecessarily obscuring the subject matter disclosed herein. Like reference numerals refer to like elements throughout the specification and drawings.

It will be understood that when an element is referred to as being "coupled" or "connected" to a certain element, it may be directly coupled or connected to the certain element or may be indirectly coupled or connected to the certain element, with intervening elements being present therebetween. In the specification, when an element is referred to as "comprising" or "including" a component, it does not exclude other components but may further include other components unless a description to the contrary is specifically pointed out in context.

Figure 1B:
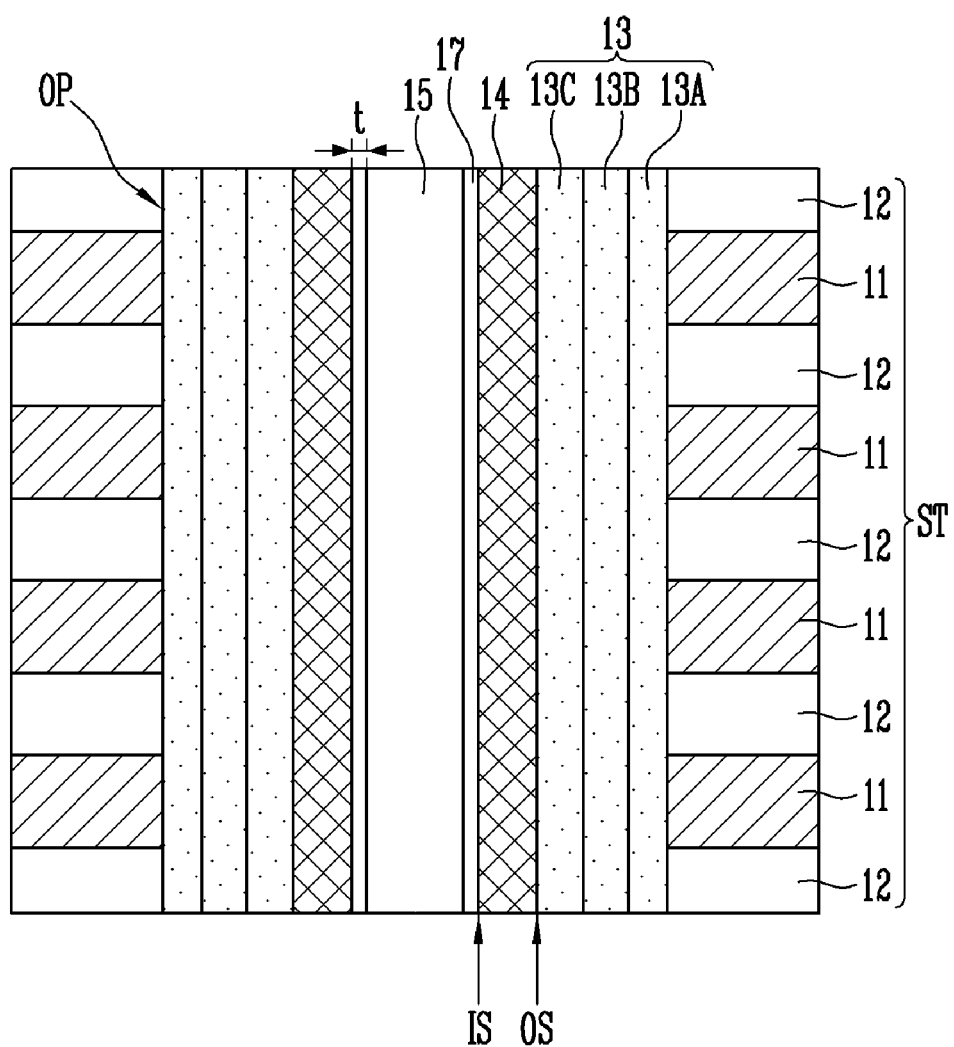

FIGS. 1A and 1B are views illustrating the structure of a semiconductor device according to an embodiment.

Referring to FIG. 1A, a semiconductor device according to an embodiment may include a stacked structure ST and a channel layer 14 on which ozone ($O_3$) treatment is performed. In addition, the semiconductor device may further include a memory layer 13 and a gap-filling insulating layer 15.

The stacked structure ST may include conductive layers 11 and insulating layers 12 alternately stacked with each other. The conductive layers 11 may be gate electrodes such as select transistors and memory cells. The conductive layers 11 may include polysilicon, tungsten, metal, and the like. The insulating layers 12 may insulate the stacked gate electrodes from each other and may include an insulating material such as an oxide or a nitride.

The stacked structure ST may include an opening OP passing through the stacked structure ST and extending in one direction. The opening OP may pass through a portion of or the entire stacked structure ST in a stacking direction. The stacking direction may refer to a direction in which the conductive layers 11 and the insulating layers 12 are stacked, and may be perpendicular to the surface of the substrate. The memory layer 13, the channel layer 14 and the gap-filling insulating layer 15 may be formed in the opening OP. The memory layer 13 may surround a sidewall of the channel layer 14 and the gap-filling insulating layer 15 may be formed in the channel layer 14.

The channel layer 14 may be an area where a channel of a select transistor and a memory cell is formed. Select transistors and memory cells may be located at intersections between the channel layer 14 and the conductive layers 11. The channel layer 14 may include a semiconductor material such as silicon (Si) and germanium (Ge).

The channel layer 14 may pass through the stacked structure ST and have a hollow central area. For example, the channel layer 14 may have a tubular shape. The channel layer 14 may include an inner surface IS and an outer surface OS. The inner surface IS may be subjected to an etch process during a manufacturing process so that the inner surface IS may be an etched surface. $O_3$ treatment may be performed on the inner surface IS. The $O_3$ treatment may be for curing defects of the inner surface IS caused by manufacturing processes. The defects in the etched surface caused by the etch process may be cured by $O_3$ treatment.

The $O_3$-treated inner surface IS of the channel layer 14 may have fewer defects than a surface on which $O_3$ treatment is not performed, or may be substantially free from defects. For example, the inner surface IS of the $O_3$-treated channel layer 14 may have few or no dangling bonds. In addition, the $O_3$-treated inner surface IS of the channel layer 14 may have a lower roughness compared to a roughness of a channel layer on which the ozone treatment is not performed.

The outer surface OS of the channel layer 14 may contact a dielectric layer. The dielectric layer may be part of the memory layer 13. The memory layer 13 may include at least one of a charge blocking layer 13A, a data storing layer 13B and a tunnel insulating layer 13C. The data storing layer 13B may include a floating gate, a charge trapping material, silicon, a nitride, nanodots, a variable resistance material, or a phase change material.

The outer surface OS of the channel layer 14 may contact the tunnel insulating layer 13C. In addition, the data storing layer 13B may surround the tunnel insulating layer 13C and the charge blocking layer 13A may surround the data storing layer 13B.

The $O_3$-treated inner surface IS of the channel layer 14 may contact the gap-filling insulating layer 15. The gap-filling insulating layer 15 may include an insulating material, such as an oxide, and have a void therein. Though not shown in FIG. 1A, the channel layer 14 may be directly coupled to a source layer, or the channel layer 14 may be coupled to the source layer through an epitaxial semiconductor layer.

Referring to FIG. 1B, a semiconductor device according to an embodiment may further include an oxide thin film 17. The oxide thin film 17 may be formed by performing $O_3$ treatment on the inner surface IS of the channel layer 14. The $O_3$-treated inner surface IS of the channel layer 14 may contact the oxide thin film 17. In addition, the gap-filling insulating layer 15 may be formed in the oxide thin film 17. The oxide thin film 17 may be a thin film having a thickness t ranging from 3 to 10 Å. The other portions of the embodiment shown in FIG. 1B are similar to portions described above with reference to FIG. 1A.

According to the above-described configuration, the inner surface IS of the channel layer 14 may be an $O_3$-treated etched surface. The $O_3$-treated etched surface may have fewer defects than an etched surface on which $O_3$ treatment is not performed. Therefore, the inner surface IS of the channel layer may improve carrier mobility and swing characteristics of a transistor.

FIGS. 2A to 2E are cross-sectional views illustrating a method of manufacturing a semiconductor device according to an embodiment.

Figure 2A:
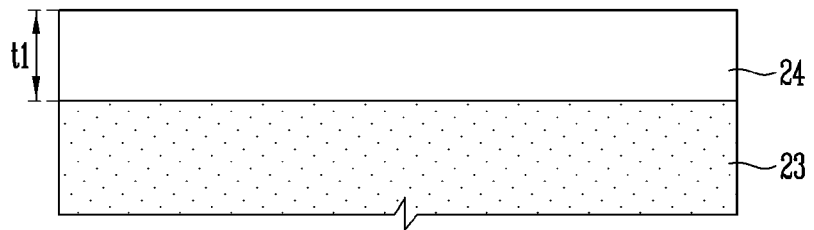
FIGS. 2A to 2E are cross-sectional views illustrating a method of manufacturing a semiconductor device according to an embodiment.

Referring to FIG. 2A, an amorphous silicon layer 24 may be formed. The amorphous silicon layer 24 may be a preliminary channel layer. The amorphous silicon layer 24 may have a thickness t1 that is sufficient to facilitate being etched during subsequent processes.

The amorphous silicon layer 24 may be formed on a dielectric layer 23. The dielectric layer 23 may include an oxide or a nitride. The dielectric layer 23 may be a single layer or a stack of multiple layers. In addition, the dielectric layer 23 may be a gate insulating layer such as a select transistor, or a memory layer of a memory cell.

Figure 2B:
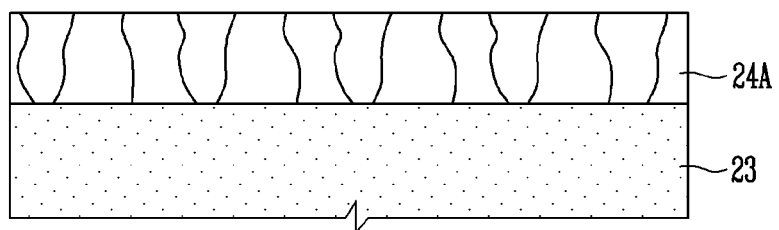

Referring to FIG. 2B, a polysilicon layer 24A may be formed by thermally treating the amorphous silicon layer 24. The polysilicon layer 24A may be formed by crystallizing the amorphous silicon layer 24. In addition, a grain size of the polysilicon layer 24A may be increased by heat treatment. The polysilicon layer 24A may be a channel layer.

Figure 2C:
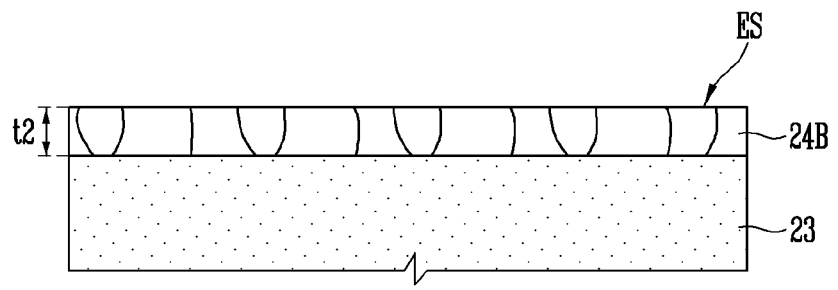

Referring to FIG. 2C, a surface of the polysilicon layer 24A may be etched. The polysilicon layer 24A may be etched to entirely reduce a thickness of the polysilicon layer 24A. Thus, a polysilicon layer 24B having an etched surface ES may have a uniform thickness t2. By reducing the thickness of the polysilicon layer 24B, swing characteristics of a select transistor and a memory cell using the polysilicon layer 24B as a channel layer may be improved.

However, when the polysilicon layer 24B is etched, defects may occur on the etched surface ES of the polysilicon layer 24B. For example, silicon bonds on the etched surface ES may be broken and dangling bonds may be created. In addition, trap sites in the polysilicon layer 24B may be increased by dangling bonds. Therefore, when the polysilicon layer 24B is used as the channel layer, charges may be trapped in the trap sites. In addition, defects may result in the increase in scattering effects and reductions in carrier mobility and swing characteristics of the transistor. In addition, roughness of the etched surface ES of the polysilicon layer 24B may be increased by the etching process. Therefore, according to an embodiment of the present disclosure, a process may be performed to cure defects of the etched surface ES.

Figure 2D:
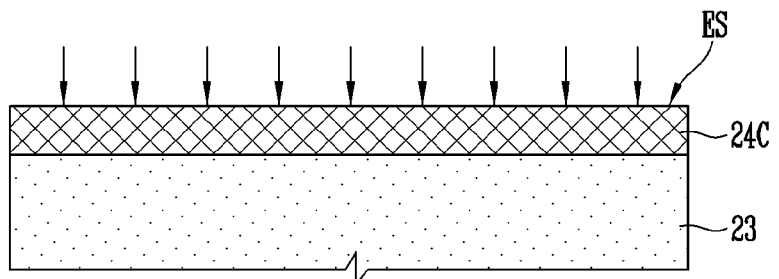

Referring to FIG. 2D, ozone ($O_3$) treatment may be performed on the etched surface ES of a polysilicon layer 24C. The $O_3$ treatment may cause the dangling bonds present on the etched surface ES of the polysilicon layer 24C to be bonded to oxygen. When ozone encounters a dangling bond, the ozone can donate oxygen atoms to the dangling bonds. Thus, the dangling bonds may be reduced or eliminated. In addition, as ozone ($O_3$) has more oxygen ions than oxygen ($O_2$) gas, the dangling bonds may be effectively cured by using the ozone ($O_3$) treatment. Therefore, the dangling bonds on the etched surface ES of the $O_3$-treated polysilicon layer 24C may be reduced, and the roughness of the etched surface ES may be reduced as well. In addition, when the dangling bonds present on the etched surface ES of the polysilicon layer 24C are bonded to oxygen, an oxide thin film may be formed on the etched surface ES (see FIG. 1B). The oxide thin film may fill aberrations of the etched surface ES having roughness.

A curing process may be performed using a thermal oxidation process. However, since the thermal oxidation process is a high-temperature process, neighboring layers may be damaged. For example, oxygen may permeate into the dielectric layer 23. Referring to the embodiment shown in FIG. 1B, oxygen may permeate into the data storing layer 13B. As a result, charge storage capabilities of the data storing layer 13B may be reduced. Thus, even though the channel layer 14 is cured by the thermal oxidation process, memory characteristics of the semiconductor device may be degraded. On the other hand, the use of ozone ($O_3$) may prevent damage to neighboring layers due to the high-temperature process. For example, oxygen may permeate into the dielectric layer 23 to prevent damage to the dielectric layer 23.

$O_3$ treatment may be performed using $O_3$ plasma. After $O_3$ gas) is injected into a plasma chamber to generate plasma, the etched surface ES of the polysilicon layer 24C may be processed in the chamber at a predetermined temperature for a predetermined time. As a result, defects in the etched surface ES of the polysilicon layer 24C may be cured.

In another embodiment, $O_3$ treatment may be performed using $O_3$ water. The $O_3$ water may be a solution containing a large amount of ozone ($O_3$). After an intermediate structure is dipped into the $O_3$ water, a cleaning process may be performed. As a result, defects in the etched surface ES of the polysilicon layer 24C may be cured.

In still another embodiment, $O_3$ treatment may be performed using $O_3$ gas). After ozone ($O_3$) gas alone is injected into a chamber, an intermediate structure may be stored at room temperature for a longer time than plasma or liquid exposure. The etched surface ES of the polysilicon layer 24C may be exposed to an ozone gas atmosphere to cure the defects of the etched surface ES of the polysilicon layer 24C.

Figure 2E:
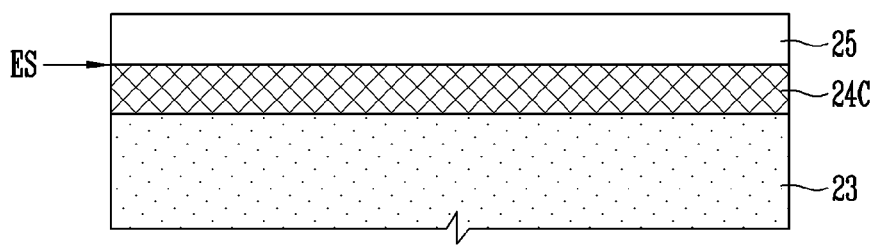

Referring to FIG. 2E, an insulating layer 25 may be formed on the etched surface ES of the $O_3$-treated polysilicon layer 24C. The insulating layer 25 may include an insulating material such as an oxide.

According to the above-described processes, by performing $O_3$ treatment on the etched surface ES of the polysilicon layer 24C, the polysilicon layer 24C may have a small thickness, and defects of the etched surface ES may be cured.

FIGS. 3A to 3E are cross-sectional views illustrating a method of manufacturing a semiconductor device according to an embodiment. In the following description, description of certain elements that are discussed above is omitted for the sake of brevity.

Figure 3A:
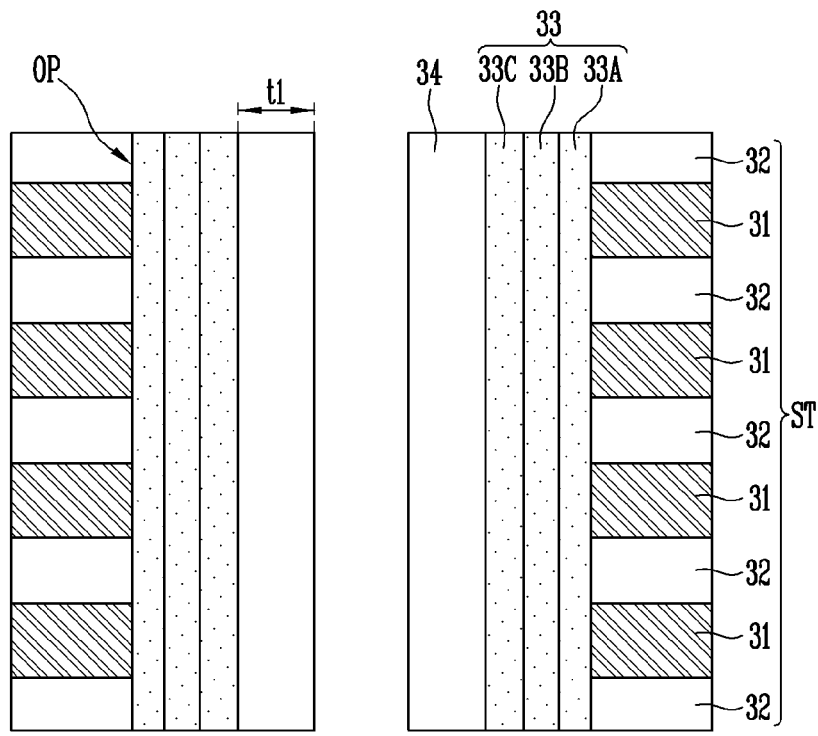
FIGS. 3A to 3E are cross-sectional views illustrating a method of manufacturing a semiconductor device according to an embodiment.

Referring to FIG. 3A, the stacked structure ST may be formed. The stacked structure ST may include first material layers 31 and second material layers 32 which are stacked alternately with each other. The first material layers 31 may be provided to form gate electrodes of memory cells and select transistors. The second material layers 32 may be provided to insulate the stacked gate electrodes from each other. The first material layers 31 may include a material having high etch selectivity with respect to the second material layers 32. For example, the first material layers 31 may be sacrificial layers including a nitride or the like, and the second material layers 32 may be insulating layers including oxide or the like. Alternatively, the first material layers 31 may be conductive layers including polysilicon, tungsten, or the like, and the second material layers 32 may be insulating layers including oxide or the like.

After the opening OP is formed through the stacked structure ST, a memory layer 33 may be formed in the opening OP. A charge blocking layer 33A, a data storing layer 33B and a tunnel insulating layer 33C may be sequentially formed in the opening OP, or at least one of them may be formed. The data storing layer 33B may include at least one of a floating gate, a charge trapping material, silicon, a nitride, nanodots, a variable resistance material, and a phase change material.

A preliminary channel layer 34 may be formed in the opening OP. The preliminary channel layer 34 may be formed in the memory layer 33 and include an amorphous silicon layer. The preliminary channel layer 34 may have a thickness t1 that is sufficient to facilitate being etched during subsequent processes. However, the preliminary channel layer 34 may have a thickness that does not completely fill the opening OP. For example, the preliminary channel layer 34 may have a tubular shape.

Figure 3B:
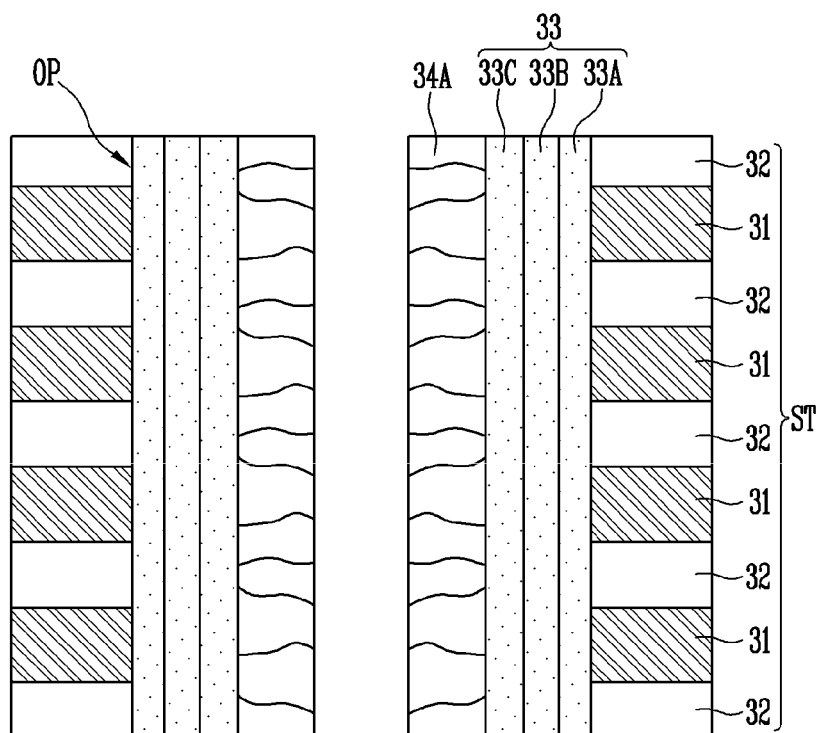

Referring to FIG. 3B, a channel layer 34A may be formed by thermally treating the preliminary channel layer 34. The preliminary channel layer 34 may include an amorphous silicon layer and the channel layer 34A may include a polysilicon layer. A polysilicon layer may be formed by crystallizing an amorphous silicon layer by heat treatment, and a grain size of the polysilicon layer may be increased by heat treatment.

Figure 3C:
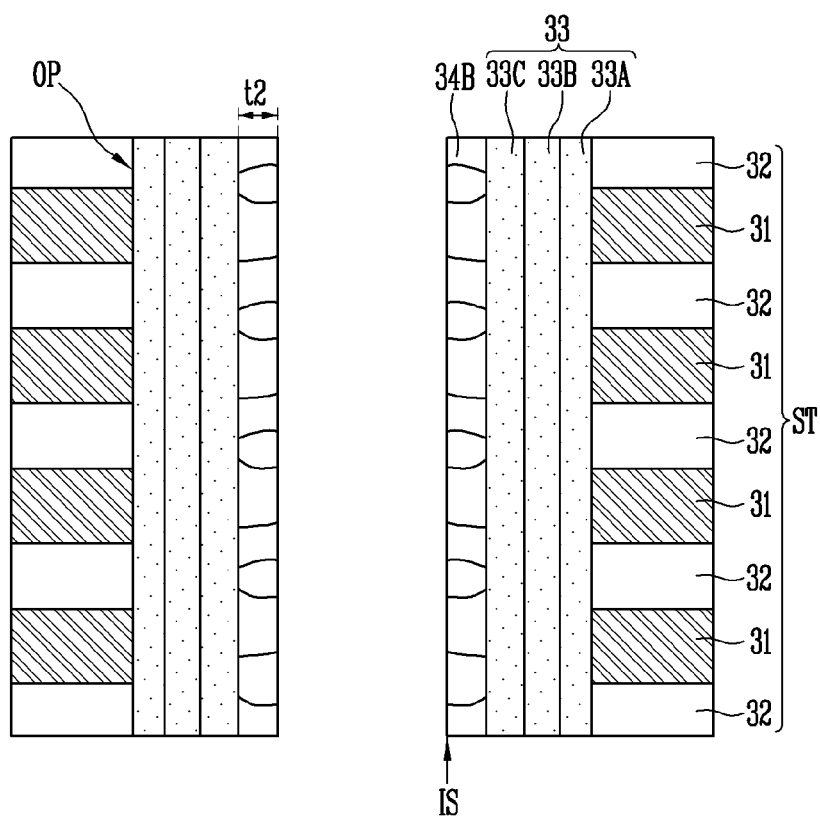

Referring to FIG. 3C, the inner surface IS of the channel layer 34A may be etched. The thickness of the channel layer 34A may be entirely reduced by the etching process so that an etched channel layer 34B has a uniform thickness t2. An isotropic etch process may be used as the etch process and may be a wet etch process. The inner surface IS of the channel layer 34B may be etched by an etchant introduced through the opening OP. Therefore, the thickness of the channel layer 34B may be reduced, and swing characteristics of a select transistor and a memory cell may be improved.

However, when the channel layer 34B is etched, defects may occur in the inner surface IS of the channel layer 34B. For example, silicon bonds on the inner surface IS may be broken and dangling bonds may be created. In addition, trap sites in the channel layer 34B may be created due to dangling bonds. Therefore, charges may be trapped in trap sites during operations of the semiconductor device such as a program operation, a read operation and the like. In addition, defects may increase scattering effects and reduce carrier mobility and swing characteristics of the transistor. In addition, roughness of the inner surface IS of the channel layer 34B may be increased. Therefore, according to an embodiment, a curing process may be performed to cure such damage.

Figure 3D:
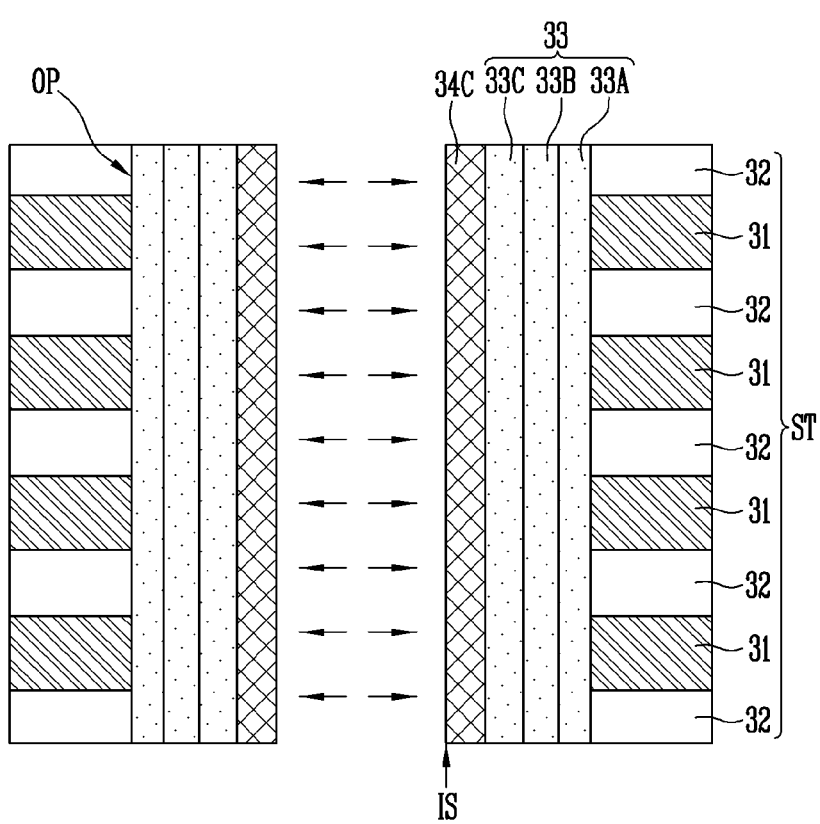

Referring to FIG. 3D, the etched inner surface IS of the channel layer 34B may be subjected to $O_3$ treatment. The $O_3$ treatment may cause the dangling bonds present on the inner surface IS of a channel layer 34C to be bonded to oxygen. As a result, the dangling bonds may be reduced or eliminated. In particular, as ozone ($O_3$) has more oxygen ions than oxygen ($O_2$) gas, ozone ($O_3$) treatment may effectively cure dangling bonds than oxygen ($O_2$) gas. Therefore, the number of dangling bonds of the inner surface IS of the $O_3$-treated channel layer 34C may be reduced, and roughness of the inner surface IS may be reduced as well. In addition, since the dangling bonds present on the inner surface IS of the channel layer 34C are bonded to oxygen, an oxide thin film may be formed on the inner surface IS (see FIG. 1B).

When the curing process is performed using $O_3$, it may be possible to prevent neighboring layers from being damaged by a high-temperature process. For example, damage to the memory layer 33 or the data storing layer 33B caused by oxygen permeated to those layers may be prevented. Therefore, the reduction of charge storage capabilities of the memory layer 33 or the data storing layer 33B due to the permeated oxygen may be prevented by using $O_3$ in the curing process.

$O_3$ treatment may be performed using $O_3$ plasma, $O_3$ water, or $O_3$ gas). The damaged inner surface IS of the channel layer 34C may be cured by the $O_3$ treatment.

Figure 3E:
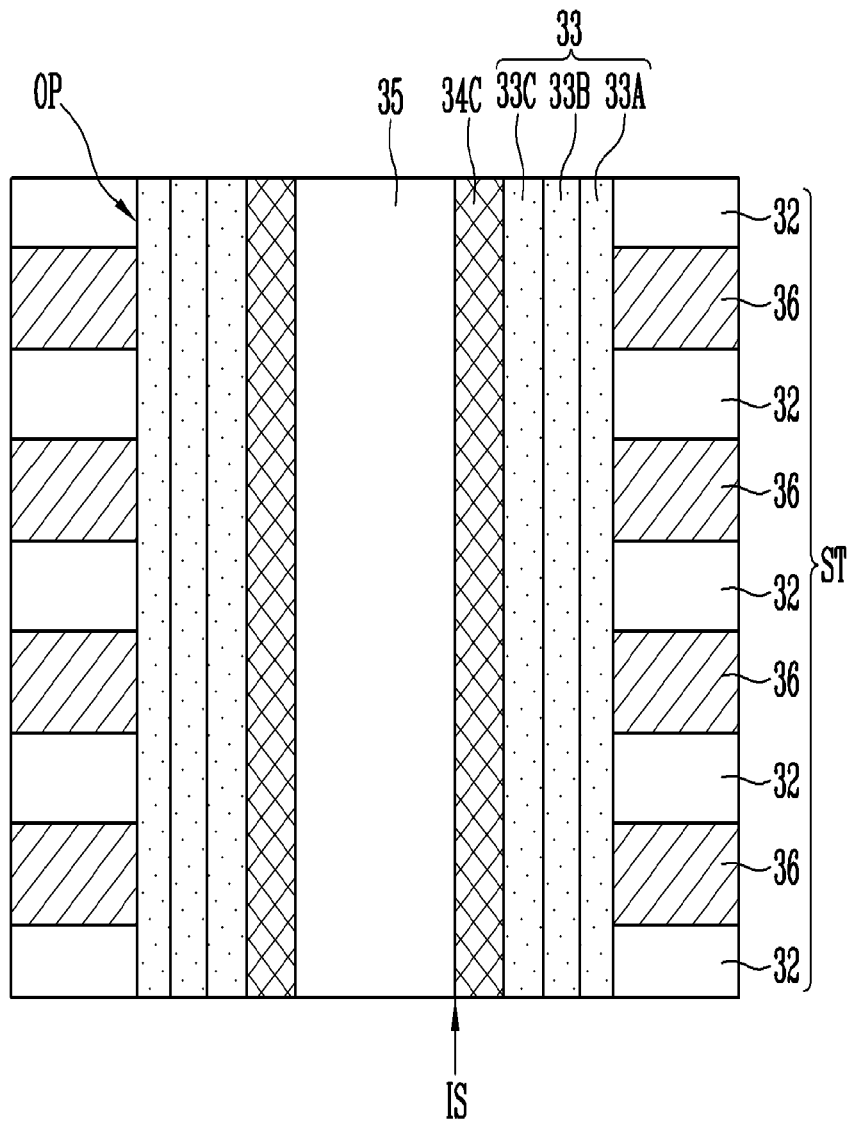

Referring to FIG. 3E, the gap-filling insulating layer 35 may be formed in the $O_3$-treated channel layer 34C. The gap-filling insulating layer 35 may be formed in a hole defined by the $O_3$-treated channel layer 34C. The gap-filling insulating layer 35 may be deposited on the $O_3$-treated inner surface IS. The gap-filling insulating layer 35 may completely fill the opening OP or have a void therein so that the hole is partially filled. The insulating layer 35 may include an insulating material such as an oxide.

Subsequently, the first material layers 31 or the second material layers 32 may be replaced by third material layers 36. For example, when the first material layers 31 are sacrificial layers and the second material layers 32 are insulating layers, the first material layers 31 may be replaced by conductive layers. In another embodiment, when the first material layers 31 are conductive layers and the second material layers 32 are insulating layers, the first material layers 31 may be silicided.

According to the above-described processes, performing $O_3$ treatment on the inner surface IS of the channel layer 34C may cure defects in the channel layer 34C. Thus, the channel layer 34C may have a relatively thin thickness and also have the inner surface IS with fewer or no defects. In particular, embodiments of the present disclosure cure defects that are present in the etched surface of the channel layer 34C having a vertical structure, e.g. defects of the inner surface IS.

Figure 4:
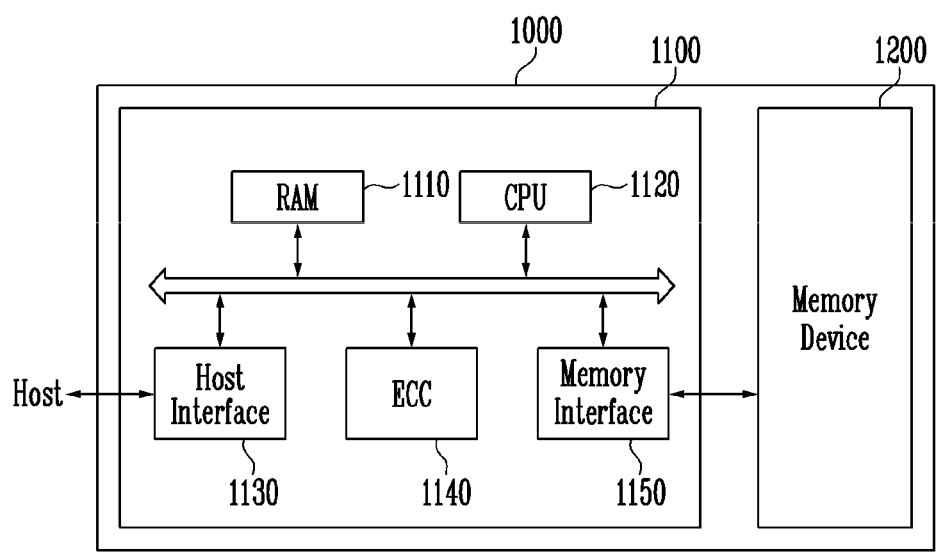
FIGS. 4 and 5 are block diagrams illustrating a configuration of a memory system according to an embodiment.

FIG. 4 is a block diagram illustrating the configuration of a memory system 1000 according to an embodiment.

Referring to FIG. 4, the memory system 1000 according to an embodiment may include a memory device 1200 and a controller 1100.

The memory device 1200 may be used to store various types of data such as text, graphic, and software code. The memory device 1200 may be a non-volatile memory device. In addition, the memory device 1200 may have the structure described as above with reference to FIGS. 1A to 3E, and may be manufactured by the method as described above with reference to FIGS. 1A to 3E. Since the memory device 1200 is configured and manufactured in the same manner as described above, a detailed description thereof will be omitted.

The controller 1100 may be coupled to a host and the memory device 1200 and configured to access the memory device 1200 in response to a request from the host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may serve as an operation memory of the CPU 1120, a cache memory between the memory device 1200 and the host, a buffer memory between the memory device 1200 and the host, or the like. For reference, the RAM 1110 may be replaced with a static random access memory (SRAM), a read only memory (ROM), or the like.

The CPU 1120 may control the overall operation of the controller 1100. For example, the CPU 1120 may operate firmware such as a flash translation layer (FTL) stored in the RAM 1110.

The host interface 1130 may interface with the host. For example, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 may use an error correction code (ECC) to detect and correct errors in data read from the memory device 1200.

The memory interface 1150 may interface with the memory device 1200. For example, the memory interface 1150 may include a NAND interface or a NOR interface.

For reference, the controller 1100 may further include a buffer memory (not shown) for temporarily storing data. The buffer memory may be used to temporarily store data to be transferred from the host interface 1130 to an external device, or data to be transferred from the memory interface 1150 to the memory device 1200. The controller 1100 may further include a ROM which stores code data to interface with the host.

Since the memory system 1000 according to the embodiment includes the memory device 1200 having improved integration density and characteristics, the memory system 1000 may also have improved integration density and characteristics accordingly.

Figure 5:
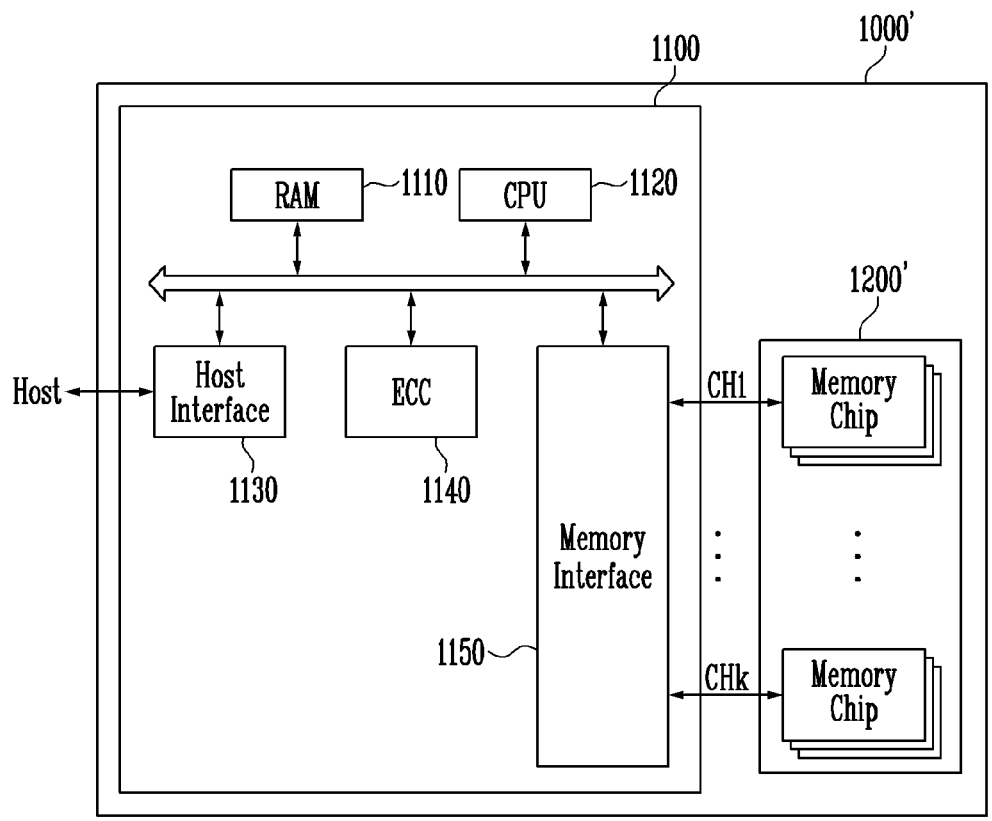

FIG. 5 is a block diagram illustrating the configuration of a memory system 1000' according to an embodiment. In the following description, description of certain elements that are discussed above is omitted for the sake of brevity.

Referring to FIG. 5, the memory system 1000' according to the embodiment may include a memory device 1200' and the controller 1100. The controller 1100 may include the RAM 1110, the CPU 1120, the host interface 1130, the ECC circuit 1140 and the memory interface 1150.

The memory device 1200' may be a non-volatile memory device. In addition, the memory device 1200' may have the structure described above with reference to FIGS. 1A to 3E, and may be manufactured by the manufacturing method described above with reference to FIGS. 1A to 3E. Since the memory device 1200' is configured and manufactured in the same manner as described above, a detailed description thereof will be omitted.

In addition, the memory device 1200' may be a multi-chip package including a plurality of memory chips. The plurality of memory chips may be divided into a plurality of groups, which may communicate with the controller 1100 through first to kth channels CH1 to CHk, respectively. In addition, memory chips, included in a single group, may be suitable for communicating with the controller 1100 through a common channel. For reference, the memory system 1000' may be modified such that each memory chip is coupled to a corresponding single channel.

As described above, since the memory system 1000' according to the embodiment includes the memory device 1200' having improved integration and characteristics, the integration and characteristics of the memory system 1000' may also be improved. In addition, since the memory device 1200' is formed into a multi-chip package, data storage capacity and driving speed of the memory system 1000' may be further increased.

Figure 6:
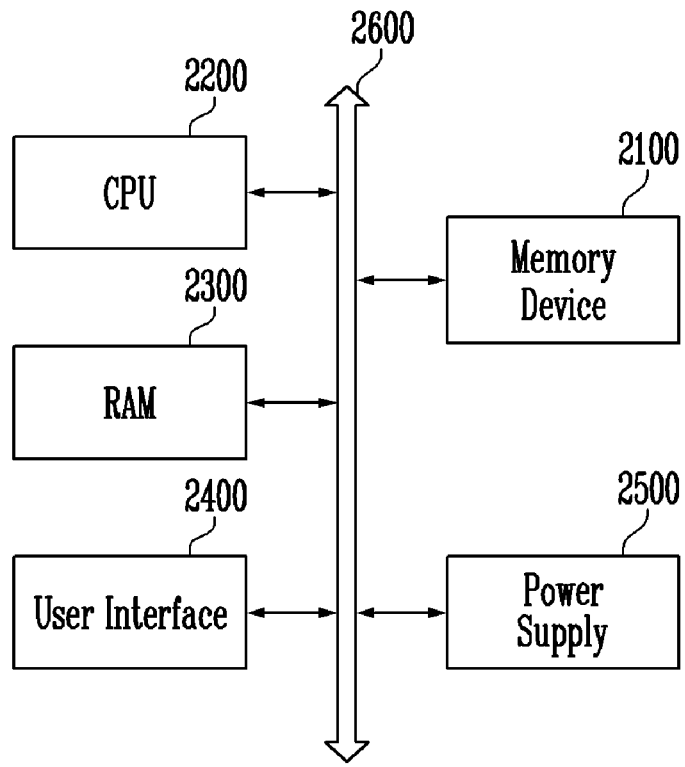
FIGS. 6 and 7 are block diagrams illustrating a configuration of a computing system in accordance with an embodiment of the present disclosure.

FIG. 6 is a block diagram illustrating the configuration of a computing system 2000 according to an embodiment. Hereinafter, any repetitive detailed description of components already mentioned above will be omitted.

As illustrated in FIG. 6, the computing system 2000 may include a memory device 2100, a CPU 2200, a random-access memory (RAM) 2300, a user interface 2400, a power supply 2500 and a system bus 2600.

The memory device 2100 may store data provided via the user interface 2400, data processed by the CPU 2200, and the like. The memory device 2100 may be electrically coupled to the CPU 2200, the RAM 2300, the user interface 2400, and the power supply 2500 by the system bus 2600.

For example, the memory device 2100 may be coupled to the system bus 2600 via a controller (not shown), or may be directly to the system bus 2600. When the memory device 2100 is directly coupled to the system bus 2600, functions of the controller may be performed by the CPU 2200 and the RAM 2300.

The memory device 2100 may be a nonvolatile memory. In addition, the memory device 2100' may have the structure described above with reference to FIGS. 1A to 3E, and may be manufactured by the manufacturing method described above with reference to FIGS. 1A to 3E. Since the memory device 2100' is configured and manufactured in the same manner as described above, a detailed description thereof will be omitted.

In addition, as described above with reference to FIG. 5, the memory device 2100 may be a multi-chip package composed of a plurality of memory chips.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to the embodiment includes the memory device 2100 having improved integration and characteristics, the characteristics of the computing system 2000 may also be improved.

Figure 7:
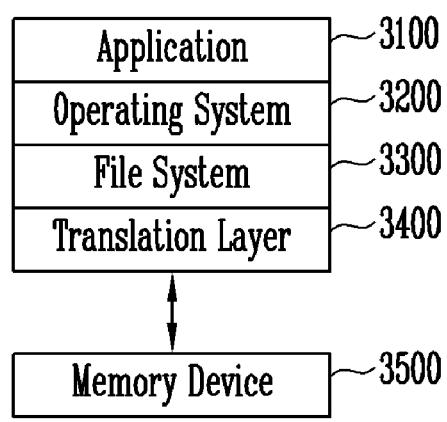

FIG. 7 is a block diagram illustrating a computing system 3000 according to an embodiment.

As illustrated in FIG. 7, the computing system 3000 according to an embodiment may include a software layer that has an operating system 3200, an application 3100, a file system 3300, and a translation layer 3400. The computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data and store them in the memory device 3500 according to given rules. The file system 3300 may be determined depending on the operating system 3200 used in the computing system 3000. For example, when the operating system 3200 is a Microsoft Windows-based system, the file system 3300 may be a file allocation table (FAT) or an NT file system (NTFS). In addition, the operating system 3200 is a Unix/Linux system, the file system 3300 may be an extended file system (EXT), a Unix file system (UFS), a journaling file system (JFS), or the like.

FIG. 7 illustrates the operating system 3200, the application 3100, and the file system 3300 in separate blocks. However, the application 3100 and the file system 3300 may be included in the operating system 3200.

The translation layer 3400 may translate an address into a suitable form for the memory device 3500 in response to a request from the file system 3300. For example, the translation layer 3400 may translate a logic address, generated by the file system 3300, into a physical address of the memory device 3500. Mapping information of the logical address and the physical address may be stored in an address translation table. For example, the translation layer 3400 may be a flash translation layer (FTL), a universal flash storage link layer (ULL), or the like.

The memory device 3500 may be a nonvolatile memory. In addition, the memory device 3500 may have the structure described above with reference to FIGS. 1A to 3E, and may be manufactured by the manufacturing method described above with reference to FIGS. 1A to 3E. Since the memory device 3500 is configured and manufactured in the same manner as described above, a detailed description thereof will be omitted.

The computing system 3000 having the above-described configuration may be divided into an operating system layer that is operated in an upper layer region and a controller layer that is operated in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, since the computing system 3000 according to the embodiment includes the memory device 3500 having improved integration density and characteristics, characteristics of the computing system 3000 may also be improved.

In accordance with various embodiments of the invention, a semiconductor device having a stabilized structure and improved reliability may be provided. In addition, a method of manufacturing a semiconductor device may be simplified with lower manufacturing costs.

What is claimed is:

1. A method of manufacturing a semiconductor device, the method comprising:
    forming a stacked structure;
    forming an opening in the stacked structure;
    forming an amorphous silicon layer in the opening;
    forming a polysilicon layer by performing heat treatment on the amorphous silicon layer;
    etching an inner surface of the polysilicon layer using a wet etch process;
    permeating oxygen ions into a wet-etched inner surface of the polysilicon layer; and
    performing a cleaning process on the inner surface of the polysilicon layer into which the oxygen ions are permeated.

2. The method of claim 1, wherein the amorphous silicon layer is crystallized to form the polysilicon layer and a grain size of the polysilicon layer is increased, by the heat treatment.

3. The method of claim 1, wherein the wet-etched inner surface includes a defect and the defect is cured by permeating the oxygen ions.

4. The method of claim 1, wherein the permeating the oxygen ions is performed using $O_3$ water.

5. The method of claim 1, wherein the stacked structure includes first material layers and second material layers stacked alternately with each other.

6. A method of manufacturing a semiconductor device, the method comprising:
    forming a stacked structure including first material layers and second material layers stacked alternately with each other;
    forming an opening passing through the stacked structure;
    forming a preliminary channel layer in the opening;
    forming a channel layer by performing heat treatment on the preliminary channel layer;
    etching an inner surface of the channel layer using a wet etch process to form a defect in the inner surface; and
    permeating oxygen ions into the wet-etched inner surface of the channel layer to cure the defect.

7. The method of claim 6, further comprising performing a cleaning process on the inner surface of the channel layer into which the oxygen ions are permeated.

8. The method of claim 6, further comprising forming a memory layer in the opening before forming the preliminary channel layer.

9. The method of claim 6, further comprising forming a gap-filling insulating layer in a hole defined by the channel layer subjected to the permeating of the oxygen ions.

10. A method of manufacturing a semiconductor device, the method comprising:
    depositing an amorphous silicon layer on a dielectric layer;
    forming a polysilicon layer by performing heat treatment on the amorphous silicon layer;
    etching the polysilicon layer using a wet etch process to reduce a thickness of the polysilicon layer; and
    permeating oxygen ions into a wet-etched surface of the polysilicon layer.

11. The method of claim 10, wherein the amorphous silicon layer is crystallized to form the polysilicon layer and a grain size of the polysilicon layer is increased, by the heat treatment.

12. The method of claim 10, wherein the wet-etched surface includes a defect and the defect is cured by permeating the oxygen ions.

13. The method of claim 10, wherein the permeating the oxygen ions is performed using $O_3$ water.

14. The method of claim 10, further comprising forming an insulating layer on the wet-etched surface subjected to the permeating the oxygen ions.

* * * * *